(12) United States Patent
Liu et al.

(10) Patent No.: US 9,059,551 B2
(45) Date of Patent: Jun. 16, 2015

(54) BACKPLANE APPARATUS AND COMMUNICATION DEVICE

(71) Applicant: HUAWEI TECHNOLOGIES CO., LTD., Shenzhen (CN)

(72) Inventors: Fangming Liu, Shenzhen (CN); Guodong Zhang, Shenzhen (CN); Sang Liu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 14/107,473

(22) Filed: Dec. 16, 2013

(65) Prior Publication Data

US 2014/0187062 A1 Jul. 3, 2014

Related U.S. Application Data

(63) Continuation of application No. PCT/CN2013/080690, filed on Aug. 2, 2013.

(30) Foreign Application Priority Data

Dec. 27, 2012 (CN) .......................... 2012 1 0578951

(51) Int. Cl.
*H01R 12/50* (2011.01)
*H01R 12/73* (2011.01)
(Continued)

(52) U.S. Cl.
CPC ............ *H01R 23/725* (2013.01); *H01R 12/737* (2013.01); *H01R 29/00* (2013.01); *H05K 7/1445* (2013.01)

(58) Field of Classification Search
CPC .... H01R 9/096; H01R 23/725; H01R 23/722; H01R 23/7073; H01R 12/57
See application file for complete search history.

(56) References Cited

U.S. PATENT DOCUMENTS

| 5,812,797 | A | 9/1998 | Crane, Jr. et al. |
| 7,102,893 | B1 | 9/2006 | MacArthur et al. |

(Continued)

FOREIGN PATENT DOCUMENTS

| CN | 201699722 | 1/2011 |
| CN | 101984599 | 3/2011 |

(Continued)

OTHER PUBLICATIONS

Extended and Supplementary European Search Report issued on Nov. 13, 2014 in corresponding European Patent Application No. 13798540.4.

(Continued)

*Primary Examiner* — Gary Paumen
(74) *Attorney, Agent, or Firm* — Staas & Halsey LLP

(57) ABSTRACT

A backplane apparatus, including a first backplane structure and a second backplane structure, where the first backplane structure is configured to transmit power and low-speed signals, and the second backplane structure is configured to transmit high-speed signals, low-speed signals, or optical signals. The first backplane structure includes a first backplane, multiple first connectors, and a connected space, where the first connectors are arranged on the first backplane and boards are electrically connected to the first backplane. The second backplane structure includes multiple second backplanes and multiple second connectors, where the second connectors are arranged on the second backplanes, the second backplanes are installed on the first backplane, and the second connectors are electrically connected to boards by crossing the connected space or via the first connectors. The present invention also discloses a communication device.

12 Claims, 19 Drawing Sheets

(51) Int. Cl.
*H05K 7/14* (2006.01)
*H01R 29/00* (2006.01)

(56) References Cited

U.S. PATENT DOCUMENTS

| | | | |
|---|---|---|---|
| 7,161,930 B1 | 1/2007 | Wang et al. | |
| 7,180,751 B1 * | 2/2007 | Geschke et al. | 361/788 |
| 7,320,609 B1 * | 1/2008 | Minich et al. | 439/79 |
| 7,794,233 B1 * | 9/2010 | Millard et al. | 439/65 |
| 8,861,222 B2 * | 10/2014 | Wen et al. | 361/788 |
| 2002/0182899 A1 * | 12/2002 | Debord et al. | 439/65 |
| 2006/0034061 A1 * | 2/2006 | Grundy et al. | 361/785 |
| 2008/0101049 A1 * | 5/2008 | Casto et al. | 361/788 |
| 2009/0181558 A1 * | 7/2009 | Morgan | 439/66 |
| 2010/0271793 A1 * | 10/2010 | Doblar et al. | 361/788 |
| 2011/0189892 A1 * | 8/2011 | Mizukami et al. | 439/607.34 |
| 2013/0107489 A1 | 5/2013 | Wen | |
| 2014/0004723 A1 * | 1/2014 | Costello | 439/64 |

FOREIGN PATENT DOCUMENTS

| | | |
|---|---|---|
| CN | 102141822 | 8/2011 |
| CN | 102289253 | 12/2011 |
| CN | 102307142 | 1/2012 |
| CN | 102681618 | 9/2012 |
| CN | 202563375 | 11/2012 |
| CN | 103051566 | 4/2013 |
| EP | 2 388 671 A2 | 11/2011 |
| WO | 03/005790 | 1/2003 |

OTHER PUBLICATIONS

PCT International Search Report and Written Opinion of the International Searching Authority dated Nov. 7, 2013 in corresponding International Patent Application No. PCT/CN2013/080690.

Office Action, dated Jan. 23, 2015, in corresponding Chinese Application No. 201210578951.8 (6 pp.).

* cited by examiner

BACKPLANE APPARATUS AND COMMUNICATION DEVICE

CROSS-REFERENCE TO RELATED APPLICATIONS

This application is a continuation of International Application No. PCT/CN2013/080690, filed on Aug. 2, 2013, which claims priority to Chinese Patent Application No. 201210578951.8, filed on Dec. 27, 2012, both of which are hereby incorporated by reference in their entireties.

TECHNICAL FIELD

The present invention relates to the field of communications technologies, and in particular, to a backplane apparatus and a communication device.

BACKGROUND

A plane is a very important component of a network communication product, and is usually installed in a back or middle position of a cabinet, to provide a power and a signal interworking channel and an interface for a board or a module, and provide mechanical support and guidance. The backplane plays an important role in a direction in which a board is inserted, heat dissipation, system capacity, assembly, and maintenance performance of network communication products. However, a backplane in a current network communication product is not only large-sized/large but also thick, which makes the backplane difficult to manufacture and its cost high.

SUMMARY

Embodiments of the present invention are intended to solve the technical problem in the prior art that a backplane is large in both size and thickness, which makes the backplane difficult to manufacture and its cost high.

In order to achieve the above objective, the embodiments of the present invention provide the following technical solution.

In one aspect, a backplane apparatus is provided, which is configured to provide with a channel and an interface for boards. The backplane apparatus includes at least one first backplane structure and at least one second backplane structure, where the first backplane structure is configured to transmit power and low-speed signals, and the second backplane structure is configured to transmit high-speed signals, low-speed signals, or optical signals. The first backplane structure includes at least one first backplane, multiple first connectors, and at least one connected space, where the first connectors are arranged on the first backplane and the boards are electrically connected to the first backplane via the first connectors. The second backplane structure includes multiple second backplanes and multiple second connectors, where the second connectors are arranged on the second backplanes, the second backplanes are installed on the first backplane, and the second connectors are electrically connected to the boards by crossing the connected space or via the first connectors.

In a first possible implementation manner, there are multiple connected spaces, and the connected spaces are hollow spaces in the first backplane.

With reference to the first possible implementation manner, in a second possible implementation manner, the second backplanes are independent of each other and structures thereof are identical or different.

With reference to the second possible implementation manner, in a third possible implementation manner, each of the second backplanes matches one or more of the boards.

With reference to the third possible implementation manner, in a fourth possible implementation manner, all or some of the second backplanes are connected to the boards via the first backplane.

With reference to the third possible implementation manner, in a fifth possible implementation manner, the second backplanes are installed on the first backplane by using parallel assembly, stacking assembly, or splicing assembly.

With reference to the third possible implementation manner, in a sixth possible implementation manner, there are multiple second backplane structures, and structures of the second backplane structures are identical or different.

With reference to the third possible implementation manner, in a seventh possible implementation manner, the second backplanes are on the same plane or different planes.

In an eighth possible implementation manner, the backplane apparatus is plugged with the boards on both sides.

With reference to the eighth possible implementation manner, in a ninth possible implementation manner, the backplane apparatus includes a pair of first backplane structures and a second backplane structure, where the second backplane structure is located between the pair of first backplane structures, and boards are inserted to both of the first backplane structures.

With reference to the eighth possible implementation manner, in a tenth possible implementation manner, the backplane apparatus includes a first backplane structure and a pair of second backplane structures, where the first backplane structure is located between the pair of second backplane structures, and boards are inserted to both of the second backplane structures.

In another aspect, a communication device is provided, which includes a cabinet and at least one board, where the board is installed inside the cabinet. The communication device further includes the above backplane apparatus installed inside the cabinet.

By using the backplane apparatus and communication device provided in the present invention, a big backplane in the prior art is split into at least one relatively big first backplane and multiple relatively small second backplanes, thereby decreasing a size and thickness of the backplane, and reducing manufacturing difficulty and a cost of the backplane.

BRIEF DESCRIPTION OF DRAWINGS

To illustrate the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
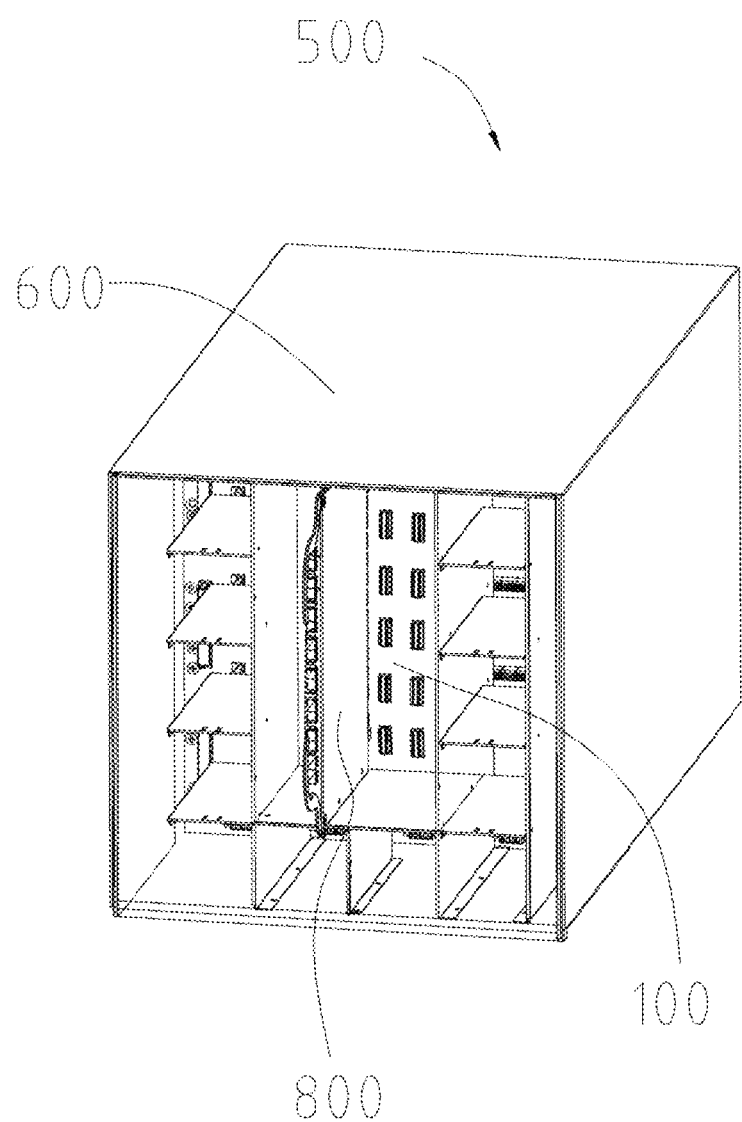
FIG. 1 is a schematic diagram of a communication device according to the present invention.
Figure 2:
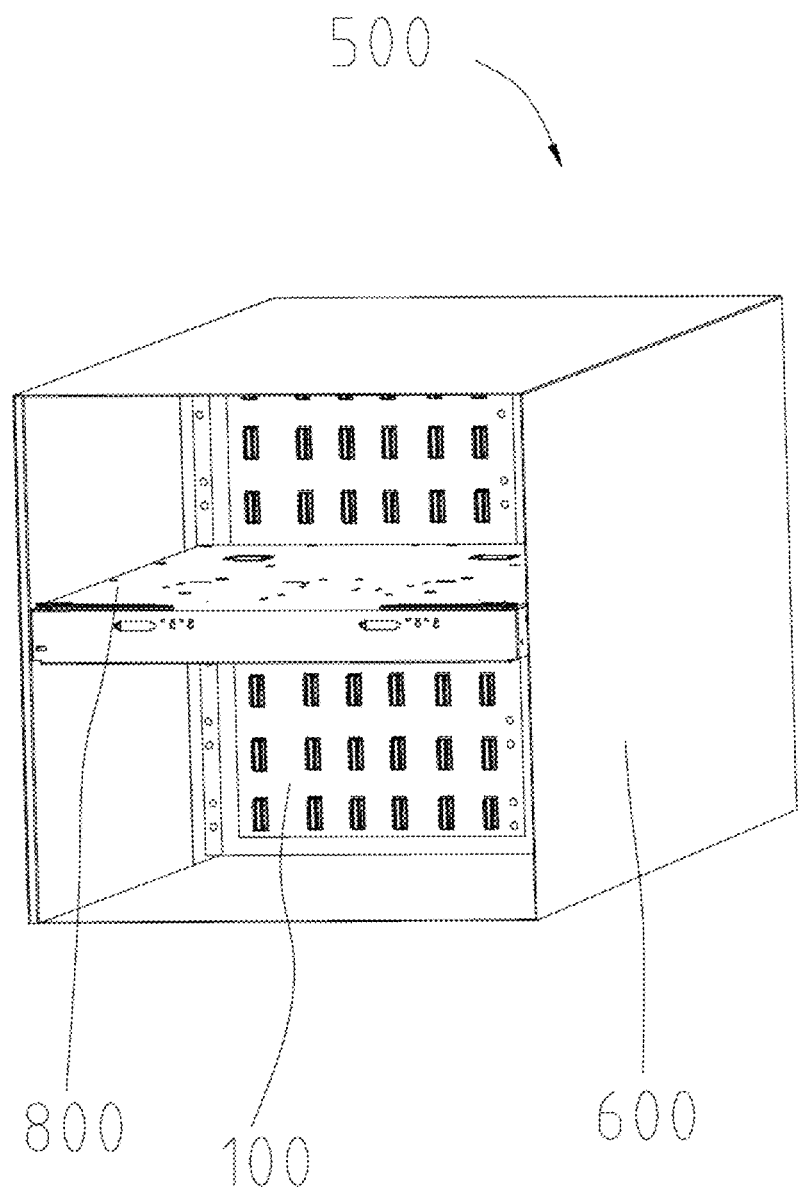
FIG. 2 is a schematic diagram of the communication device in FIG. 1 from another angle.

Referring to FIG. 1 and FIG. 2, a communication device 500 provided in an embodiment of the present invention includes a cabinet 600, a board 800, and a backplane apparatus 100. The board 800 is installed inside the cabinet 600. The backplane apparatus 100 is installed in a back or middle position of the cabinet 600 to provide the board 800 with a channel and an interface, and provide mechanical support and guidance.

In this embodiment, there may be multiple boards 800, but, for easy illustration and visibility of the backplane apparatus 100, only one board 800 is illustrated in FIG. 1 and FIG. 2.

Figure 3:
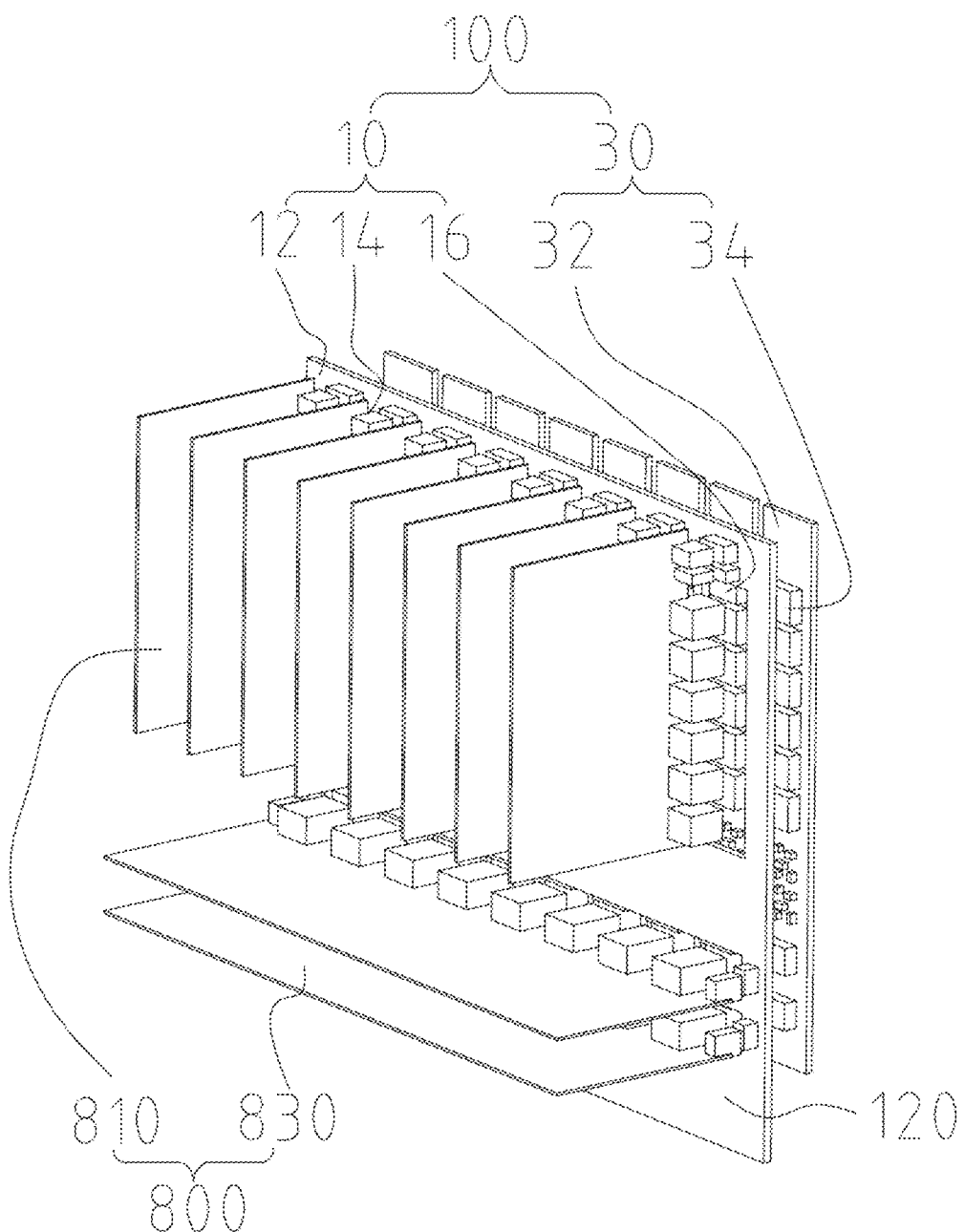
FIG. 3 is a schematic diagram of a backplane apparatus according to a first embodiment of the present invention.

Referring to FIG. 3, the backplane apparatus 100 provided in a first embodiment of the present invention includes a first backplane structure 10 and a second backplane structure 30.

In this embodiment, there may be multiple boards 800, which may be service boards, switch boards, or main control boards. For ease of description, service boards and main control boards are called first boards 810, and switch boards are called second boards 830. The boards 800 are inserted into one side of the backplane apparatus 100.

Figure 4:
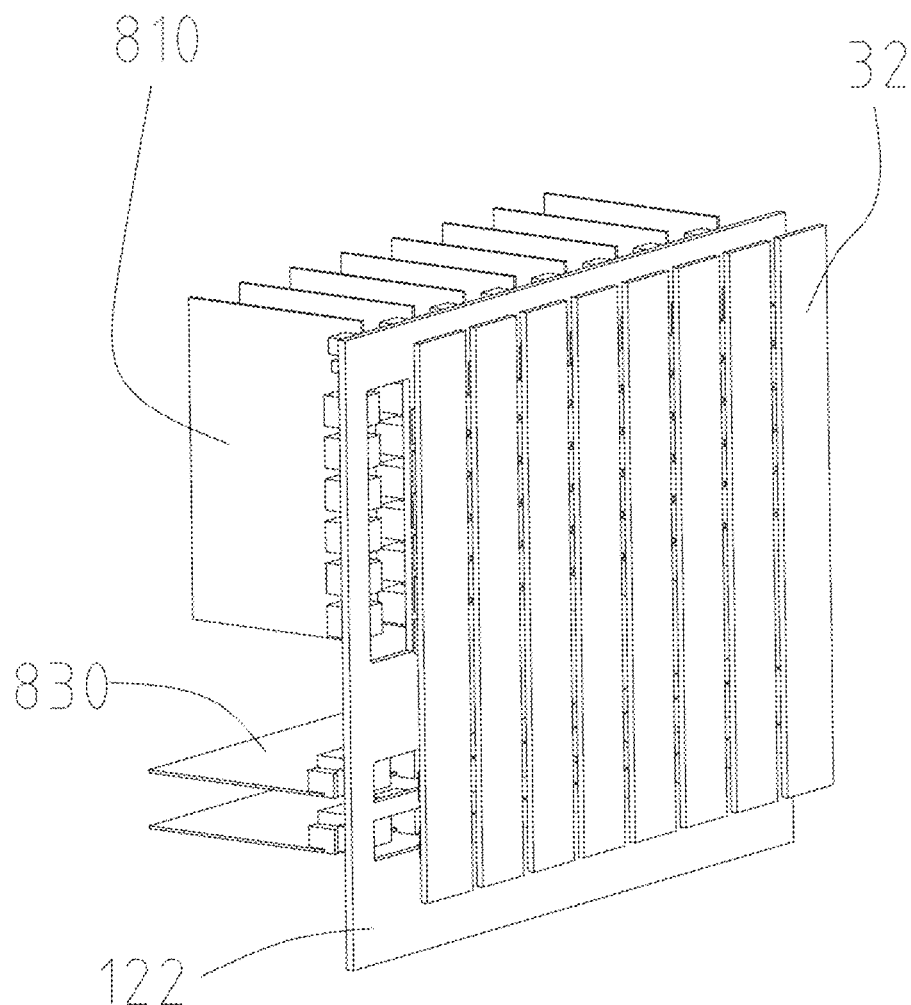
FIG. 4 is a schematic diagram of the backplane apparatus in FIG. 3 from another angle.

Also referring to FIG. 4, the first backplane structure 10 is configured to transmit power and low-speed signals, and includes a first backplane 12, multiple first connectors 14, and at least one connected space 16. The first backplane 12 is a substantially rectangular circuit board, and includes a first side 120 and a second side 122. The first side 120 and the second side 122 are set opposite to each other.

The multiple first connectors 14 are arranged on the first side 120 or second side 122 of the first backplane 12, and are configured to transmit power and low-speed signals. The boards 800 are electrically connected to the first backplane 12 via the multiple first connectors 14, so that the boards 800 are electrically connected to the first backplane 12 as horizontal boards, vertical boards, front boards, or rear boards.

In this embodiment, the multiple first connectors 14 may be power or signal connectors, or may also be optical connectors.

The at least one connected space 16 is a hollow space in the first backplane 12.

In one other embodiment, the first backplane structure 10 includes multiple connected spaces 16.

The second backplane structure 30 is configured to transmit high-speed signals, low-speed signals, or optical signals, and includes multiple second backplanes 32 and multiple second connectors 34.

In this embodiment, the multiple second backplanes 32 are independent of each other, and structures of the second backplanes 32 may be identical, and may also be different, so that each second backplane 32 can be assembled and disassembled independently and maintained individually.

As shown in FIG. 3 and FIG. 4, each of the second backplanes 32 is substantially a rectangular circuit board, and a size of each of the second backplanes 32 is smaller than a size of the first backplane 12. Each of the second backplanes 32 is installed on the second side 122 or first side 120 of the first backplane 12.

In this embodiment, the installed second backplanes 32 are located on a same plane.

The multiple second connectors 34 are arranged on the second backplanes 32, and are configured to transmit high-speed signals, low-speed signals, or optical signals. In this embodiment, the multiple second connectors 34 cross the at least one connected space 16 of the first backplane structure 10, to make the boards 800 electrically connected to the second backplanes 32.

In another embodiment, the multiple second connectors 34 may not cross the at least one connected space 16 of the first backplane structure 10 but be electrically connected to the first connectors 14, to make the boards 800 electrically connected to the second backplanes 32.

Figure 5:
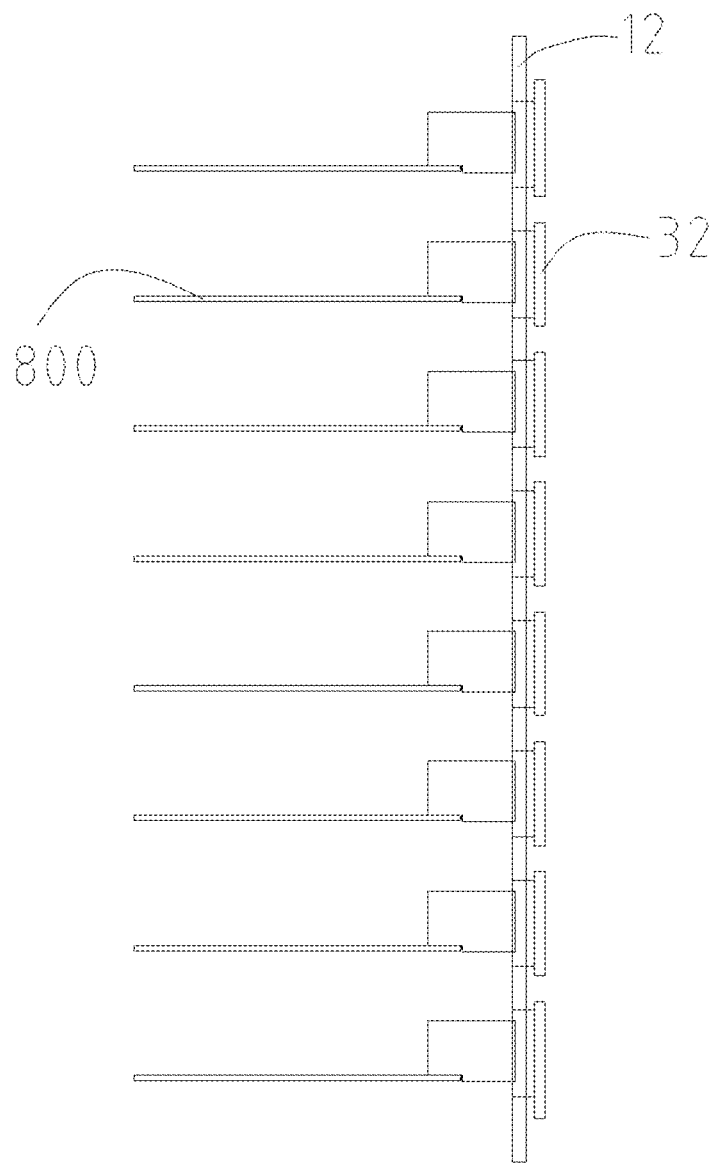
FIG. 5 is a schematic diagram of correspondence between second backplanes of the backplane apparatus in FIG. 3 and boards.

Also referring to FIG. 5, in this embodiment, one second backplane 32 matches one board 800.

Figure 6:
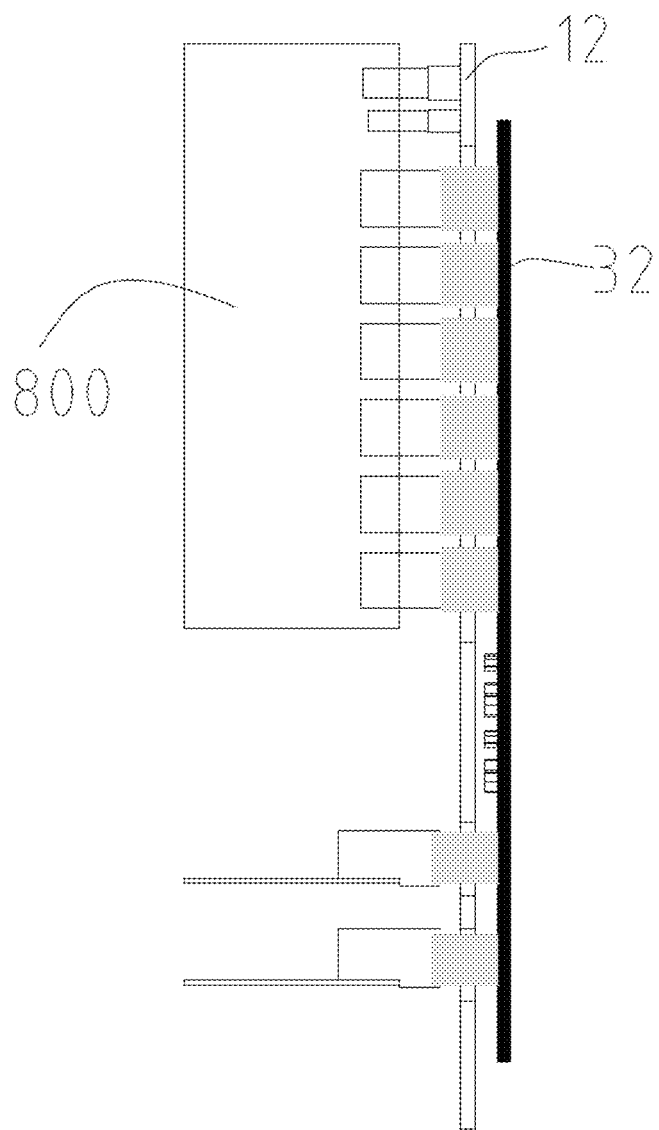
FIG. 6 is a schematic diagram of a manner in which second backplanes of the backplane apparatus in FIG. 3 and boards are connected.

Also referring to FIG. 6, the second backplanes 32 of the present invention are directly connected to the boards 800. In this embodiment, the second connectors 34 of the second backplanes 32 of the present invention cross the at least one connected space 16 of the first backplane structure 10, so that the second backplanes 32 are directly connected to the boards 800.

By using techniques such as SMT and THT, each of the second backplanes 32 is further assembled with components such as a chip, a capacitor, and a resistor, which are inconvenient to be assembled to the first backplane 12, so as to improve performance of a transmission link and a system.

Because each of the second backplanes 32 can be assembled and disassembled independently, when there is a problem that a single second backplane 32 does not work or a second connector 34 thereon encounters a pin-falling problem, the second backplane 32 can be maintained individually without affecting operation of the entire communication device 500. In other words, the present invention solves the problem in the prior art that a backplane needs to be dissembled in entirety to be returned for repair, and that the communication device 500 cannot work when the backplane is in repair.

In the backplane structure 100 of the present invention, because a big backplane in the prior art is split into at least one relatively big first backplane 12 and multiple relatively small second backplanes 32, the size and thickness of the backplane are decreased, and the manufacturing difficulty and cost of the backplane are reduced.

Figure 7:
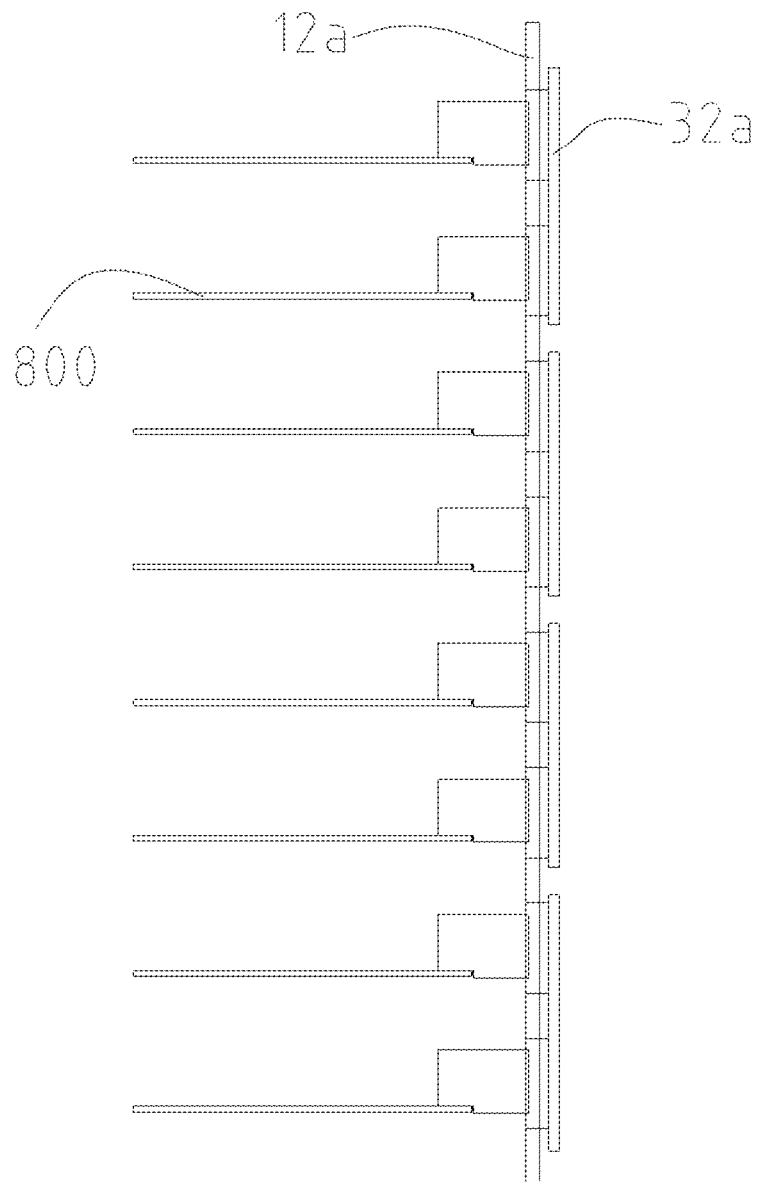
FIG. 7 is a schematic diagram of a backplane apparatus according to a second embodiment of the present invention.

Referring to FIG. 7, a second embodiment of the present invention provides a backplane apparatus, and the backplane apparatus provided in the second embodiment and the backplane apparatus 100 (refer to FIG. 1) provided in the first embodiment are basically the same in structure and implement similar functions. Their differences lie in that one second backplane 32a matches two, three, or four boards 800, which means one second backplane 32a matches multiple boards 800; and that a size of the second backplane 32a is different from a size of the second backplane 32 provided in the first embodiment, so that a first backplane 12a may match second backplanes 32a of different sizes.

Figure 8:
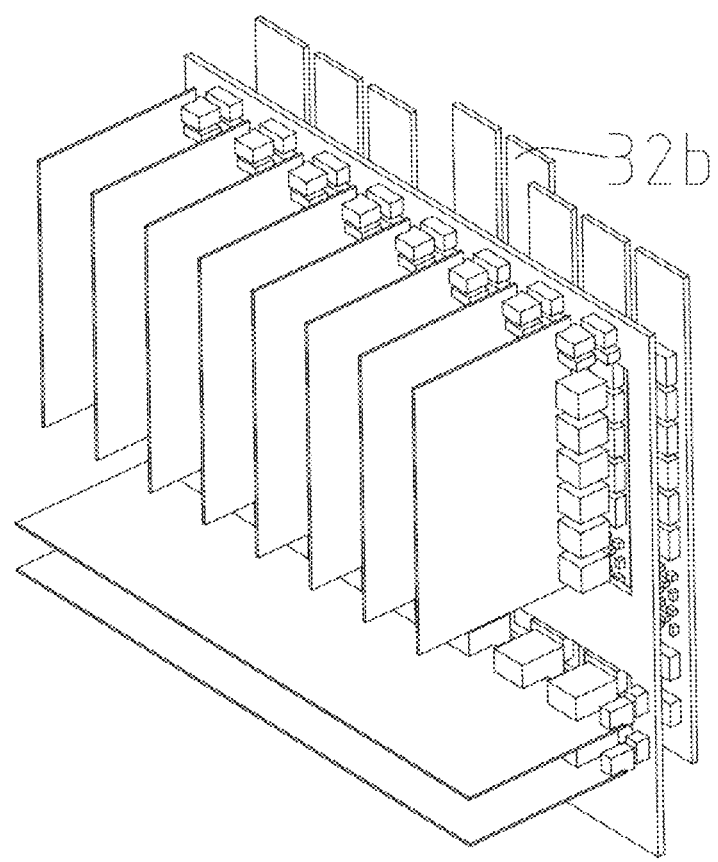
FIG. 8 is a schematic diagram of a backplane apparatus according to a third embodiment of the present invention.
Figure 9:
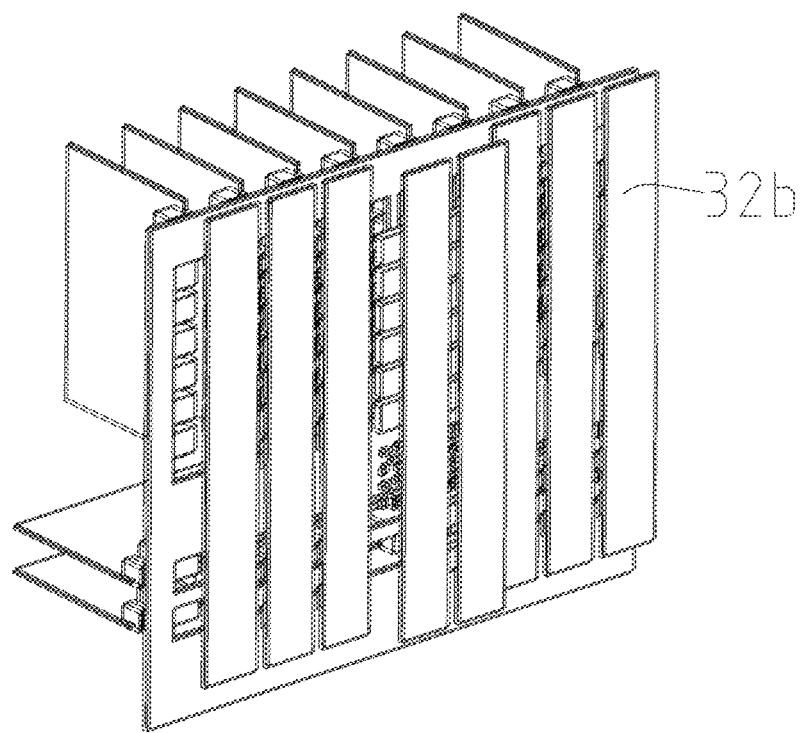
FIG. 9 is a schematic diagram of the backplane apparatus according to the third embodiment of the present invention from another angle.

Referring to FIG. 8 and FIG. 9, a third embodiment of the present invention provides a backplane apparatus, and the backplane apparatus provided in the third embodiment and the backplane apparatus 100 (refer to FIG. 1) provided in the first embodiment are basically the same in structure and implement similar functions. Their difference lies in that installed second backplanes 32b are located on different planes, to facilitate heat dissipation.

Figure 10:
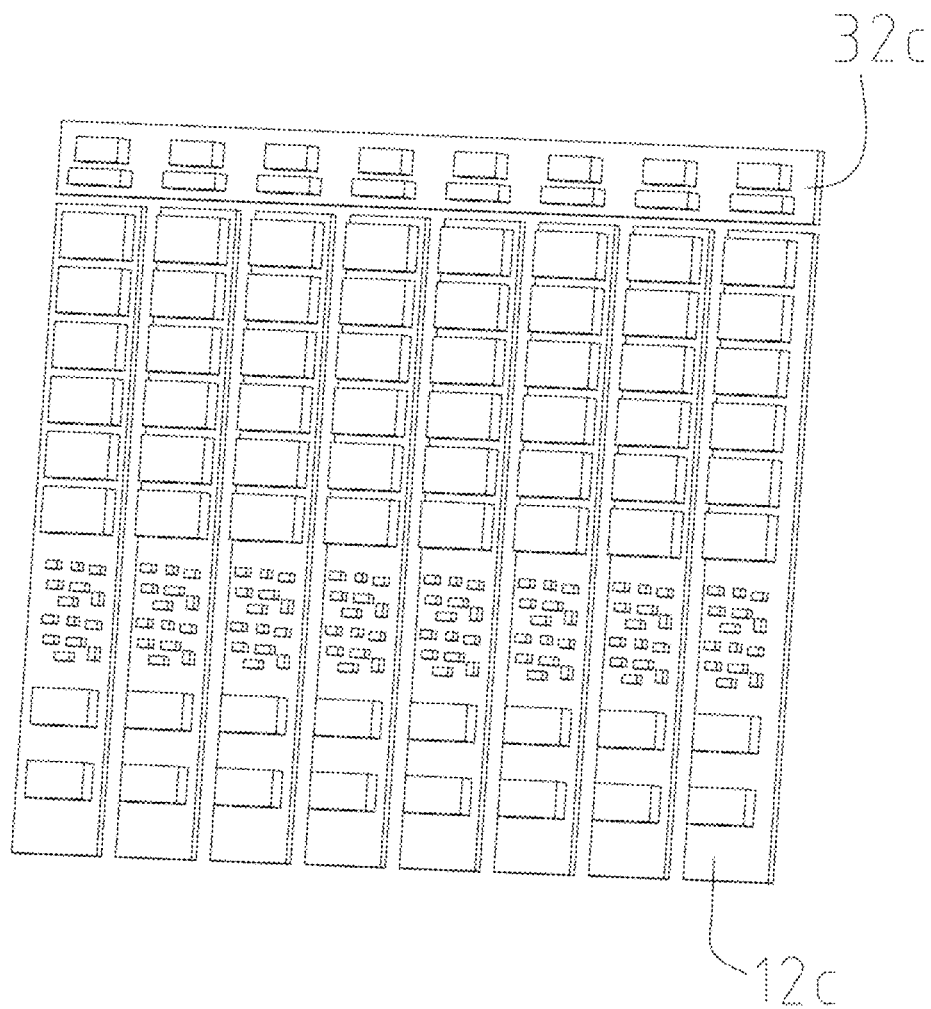
FIG. 10 is a schematic diagram of a backplane apparatus according to a fourth embodiment of the present invention.

Referring to FIG. 10, a fourth embodiment of the present invention provides a backplane apparatus, and the backplane apparatus provided in the fourth embodiment and the backplane apparatus 100 (refer to FIG. 1) provided in the first embodiment are basically the same in structure and implement similar functions. Their difference lies in that a first backplane 12c is also a backplane of a relatively small size, so that a second backplane 32c and first backplanes 12c are assembled in parallel.

Figure 11:
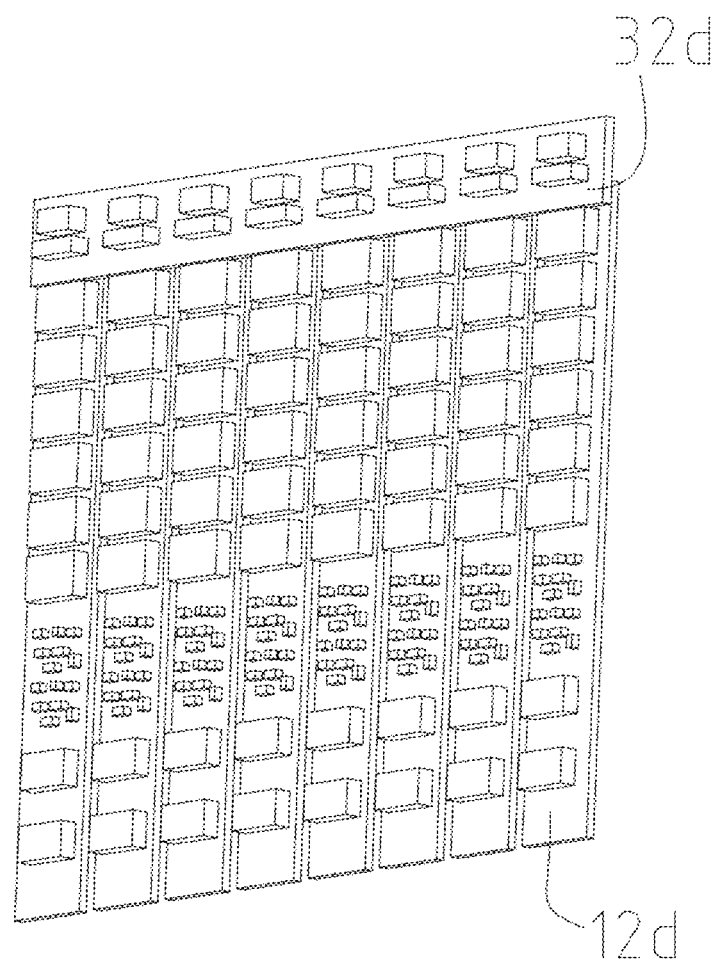
FIG. 11 is a schematic diagram of a backplane apparatus according to a fifth embodiment of the present invention.

Referring to FIG. 11, a fifth embodiment of the present invention provides a backplane apparatus, and the backplane apparatus provided in the fifth embodiment and the backplane apparatus 100 (refer to FIG. 1) provided in the first embodiment are basically the same in structure and implement similar functions. Their difference lies in that a first backplane 12d is also a backplane of a relatively small size, so that a second backplane 32d and first backplanes 12d are assembled by stacking.

Figure 12:
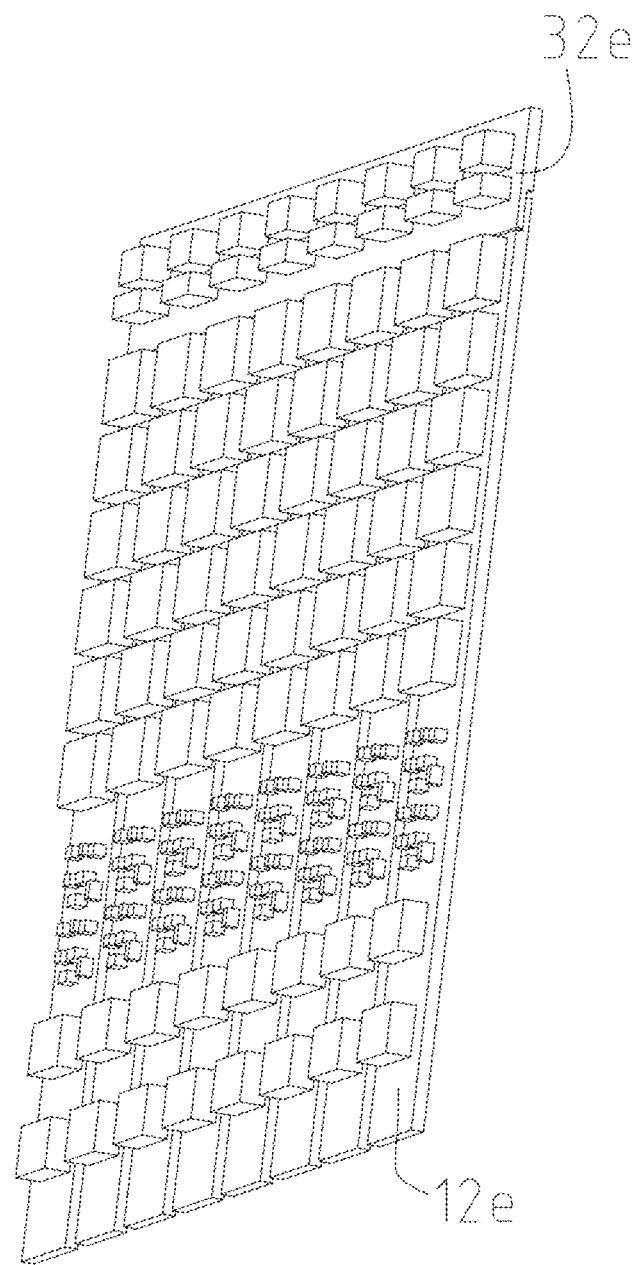
FIG. 12 is a schematic diagram of a backplane apparatus according to a sixth embodiment of the present invention.

Referring to FIG. 12, a sixth embodiment of the present invention provides a backplane apparatus, and the backplane apparatus provided in the sixth embodiment and the backplane apparatus 100 (refer to FIG. 1) provided in the first embodiment are basically the same in structure and implement similar functions. Their difference lies in that a first backplane 12e is also a backplane of a relatively small size, so that a second backplane 32e and first backplanes 12e are assembled by splicing.

Because the second backplane and the first backplane can be assembled in parallel, by stacking, or by splicing, the second backplane is independent of the first backplane. That is, both the second backplane and the first backplane can be assembled and disassembled independently. Therefore, each second backplane can be maintained individually without affecting other second backplanes or the first backplane, and the first backplane can be maintained individually without affecting the second backplanes, thereby improving maintainability of the backplane apparatus 100.

Figure 13:
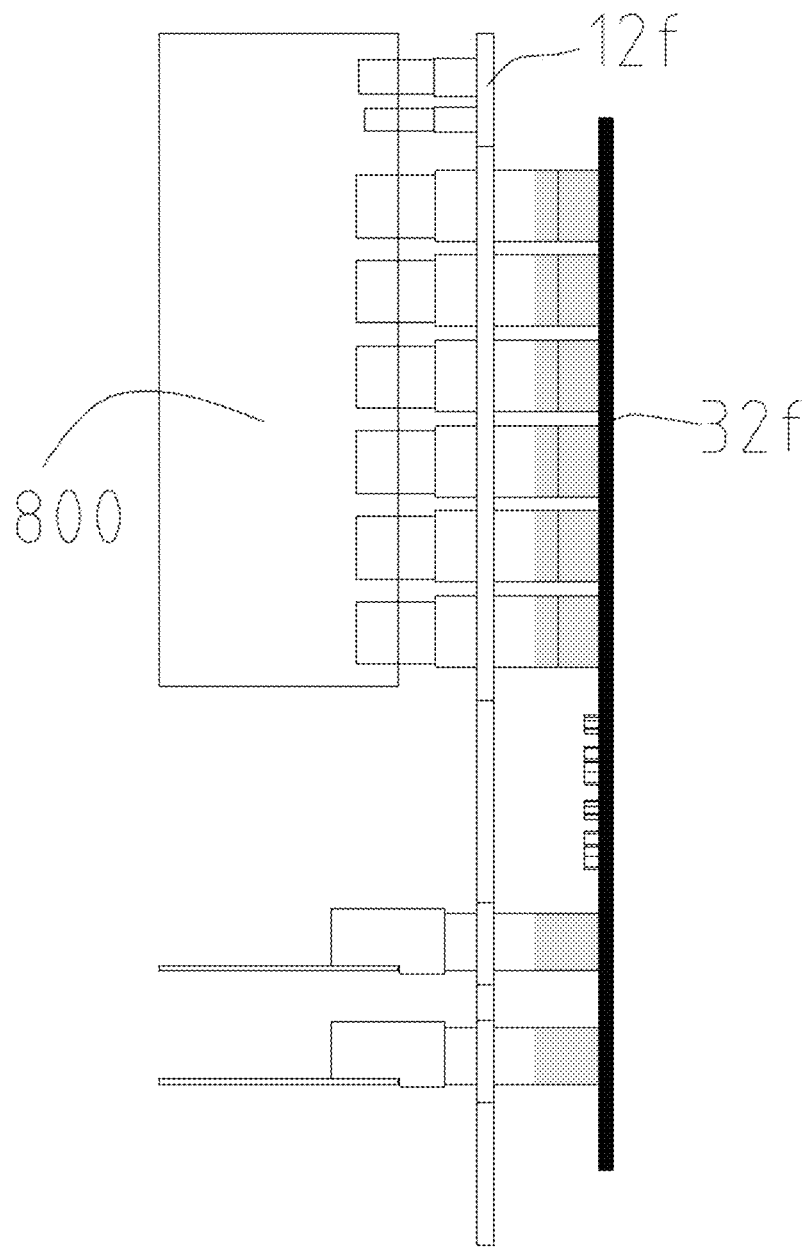
FIG. 13 is a schematic diagram of a backplane apparatus according to a seventh embodiment of the present invention.

Referring to FIG. 13, a seventh embodiment of the present invention provides a backplane apparatus, and the backplane apparatus provided in the seventh embodiment and the backplane apparatus 100 (refer to FIG. 1) provided in the first embodiment are basically the same in structure and implement similar functions. Their difference lies in that all second backplanes 32f are connected to boards 800 via a first backplane 12f.

Figure 14:
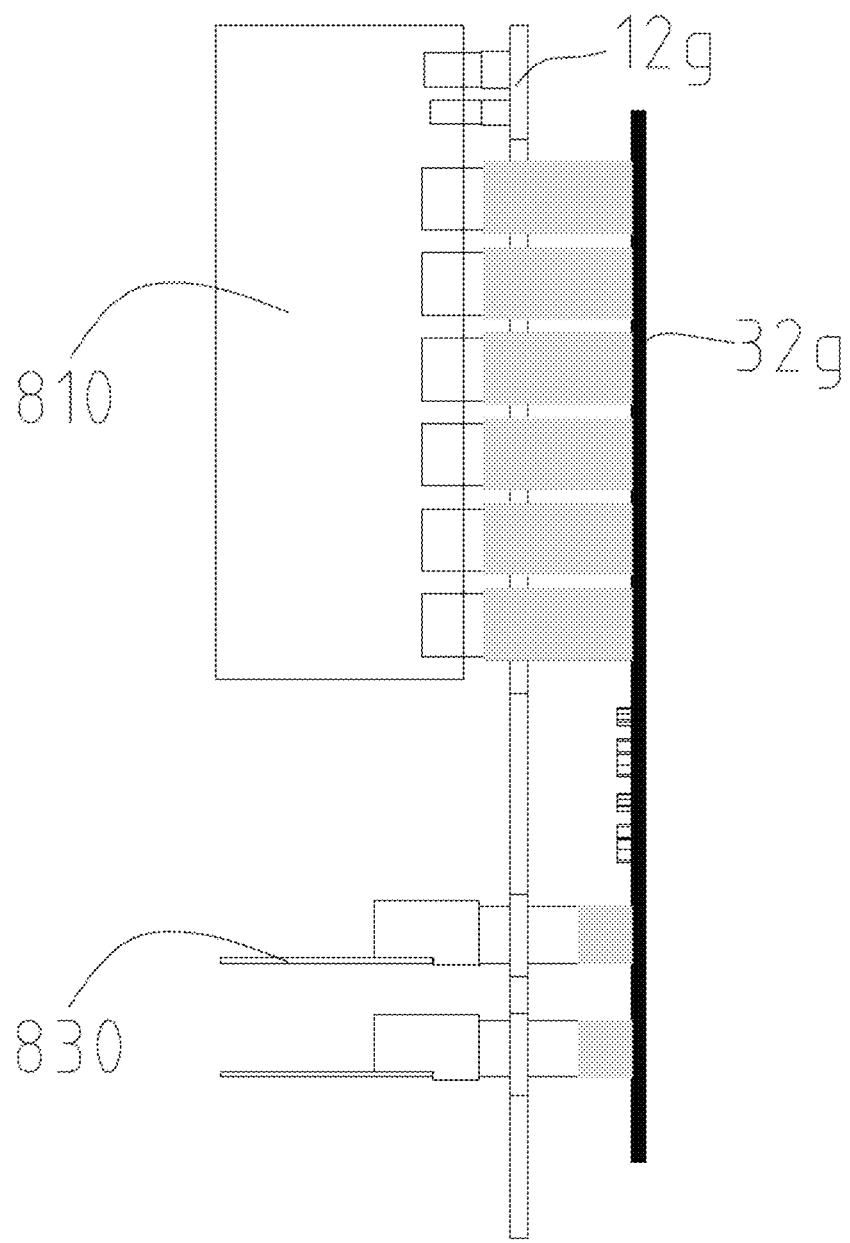
FIG. 14 is a schematic diagram of a backplane apparatus according to an eighth embodiment of the present invention.

Referring to FIG. 14, an eighth embodiment of the present invention provides a backplane apparatus, and the backplane apparatus provided in the eighth embodiment and the backplane apparatus 100 (refer to FIG. 1) provided in the first embodiment are basically the same in structure and implement similar functions. Their difference lies in that a first board 810 is directly connected to a second backplane 32g, and a second board 830 is connected to a second backplane 32g via a first backplane 12g.

Figure 15:
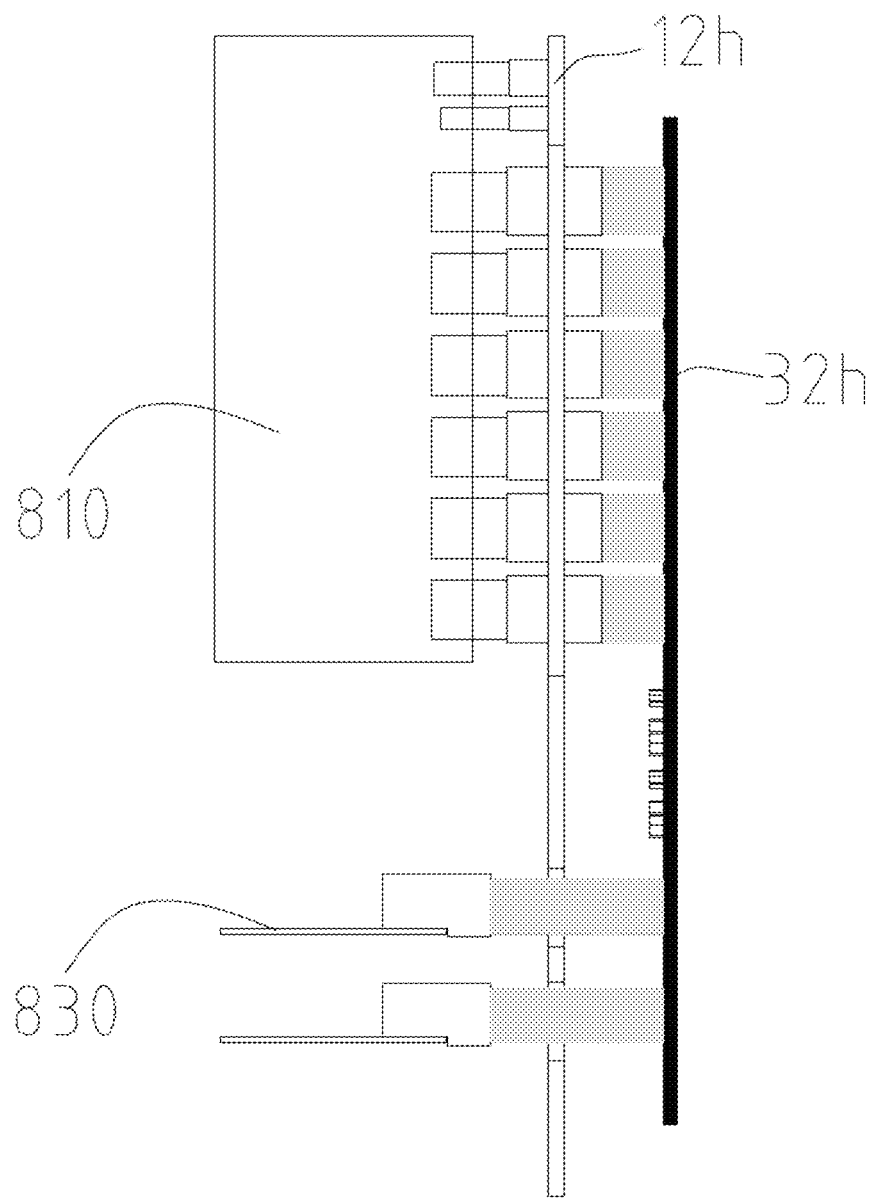
FIG. 15 is a schematic diagram of a backplane apparatus according to a ninth embodiment of the present invention.

Referring to FIG. 15, a ninth embodiment of the present invention provides a backplane apparatus, and the backplane apparatus provided in the ninth embodiment and the backplane apparatus 100 (refer to FIG. 1) provided in the first embodiment are basically the same in structure and implement similar functions. Their difference lies in that a first board 810 is connected to a second backplane 32h via a first backplane 12h, and a second board 830 is directly connected to a second backplane 32h.

Because all or some of the second backplanes of the present invention may be connected to the boards 800, or directly connected to the boards 800, the manner in which the second backplanes and the boards 800 are connected is diversified to meet different requirements.

Figure 16:
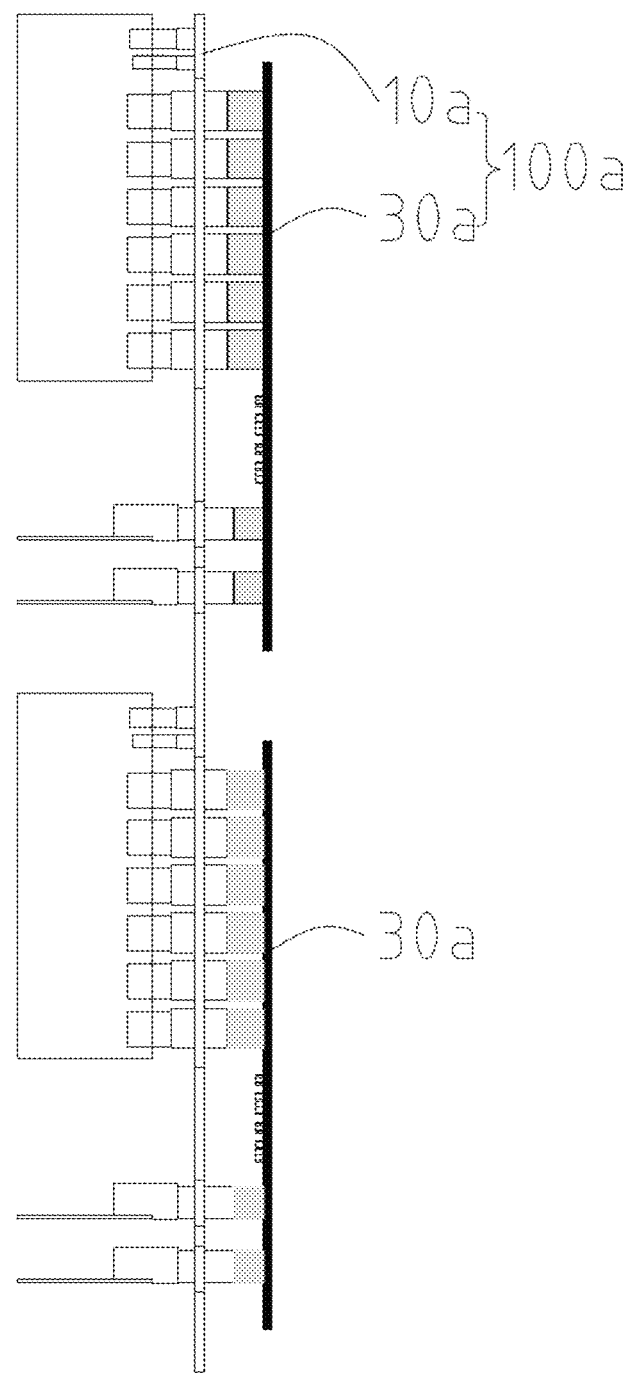
FIG. 16 is a schematic diagram of a backplane apparatus according to a tenth embodiment of the present invention.

Referring to FIG. 16, a tenth embodiment of the present invention provides a backplane apparatus 100a, and the backplane apparatus 100a provided in the tenth embodiment and the backplane apparatus 100 (refer to FIG. 1) provided in the first embodiment are basically the same in structure and implement similar functions. Their difference lies in that the backplane apparatus 100a includes a first backplane structure 10a and a pair of second backplane structures 30a, and that structures of the two second backplane structures 30a may be identical, and may also be different. Nevertheless, the number of second backplane structures 30a may be three, four or five, which means there are multiple second backplane structures 30a.

Figure 17:
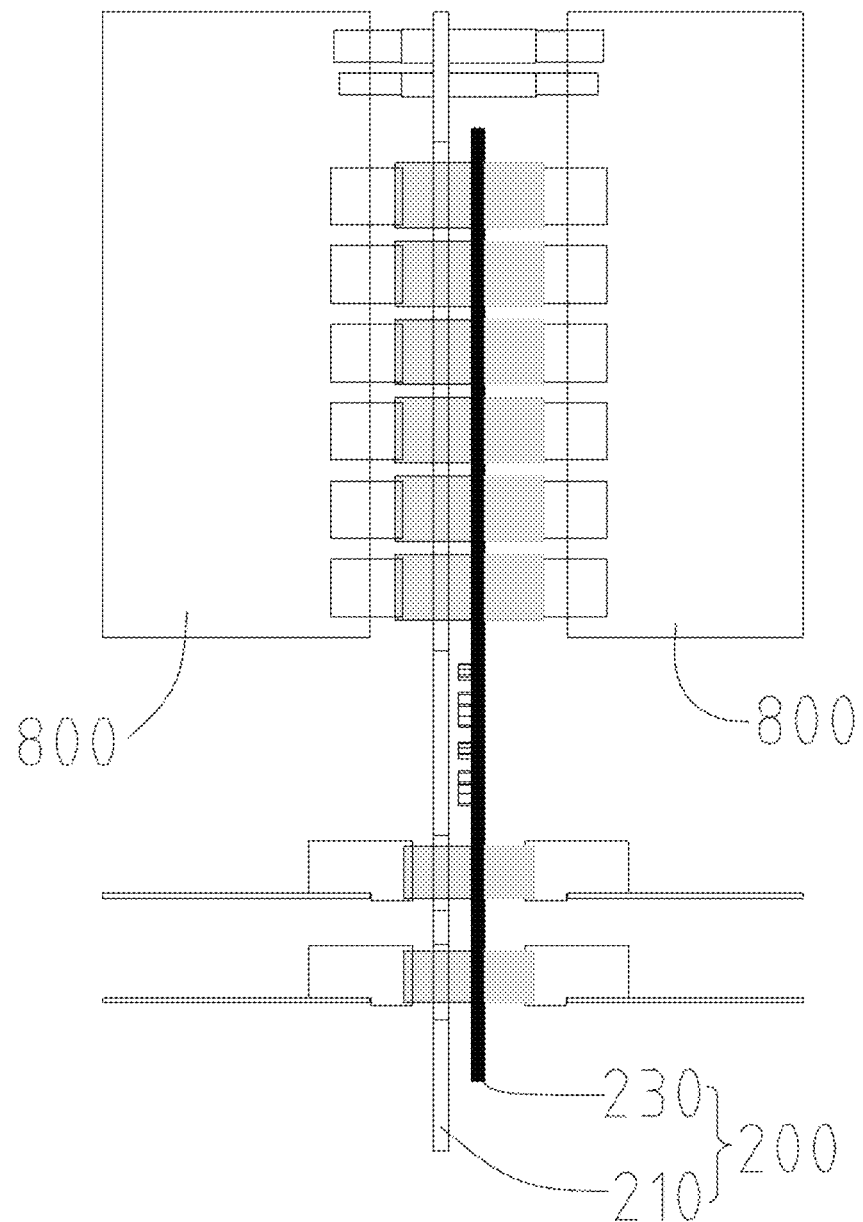
FIG. 17 is a schematic diagram of a backplane apparatus according to an eleventh embodiment of the present invention.

Referring to FIG. 17, an eleventh embodiment of the present invention provides a backplane apparatus 200, and the backplane apparatus 200 and the backplane apparatus 100 (refer to FIG. 1) provided in the first embodiment are basically the same in structure and implement similar functions. Their difference lies in that boards 800 are inserted to both sides of the backplane apparatus 200, which means the backplane apparatus 200 may have boards inserted on double sides. The backplane apparatus 200 includes a first backplane structure 210 and a second backplane structure 230, where boards 800 are inserted to the first backplane structure 210 and also the second backplane structure 230.

Figure 18:
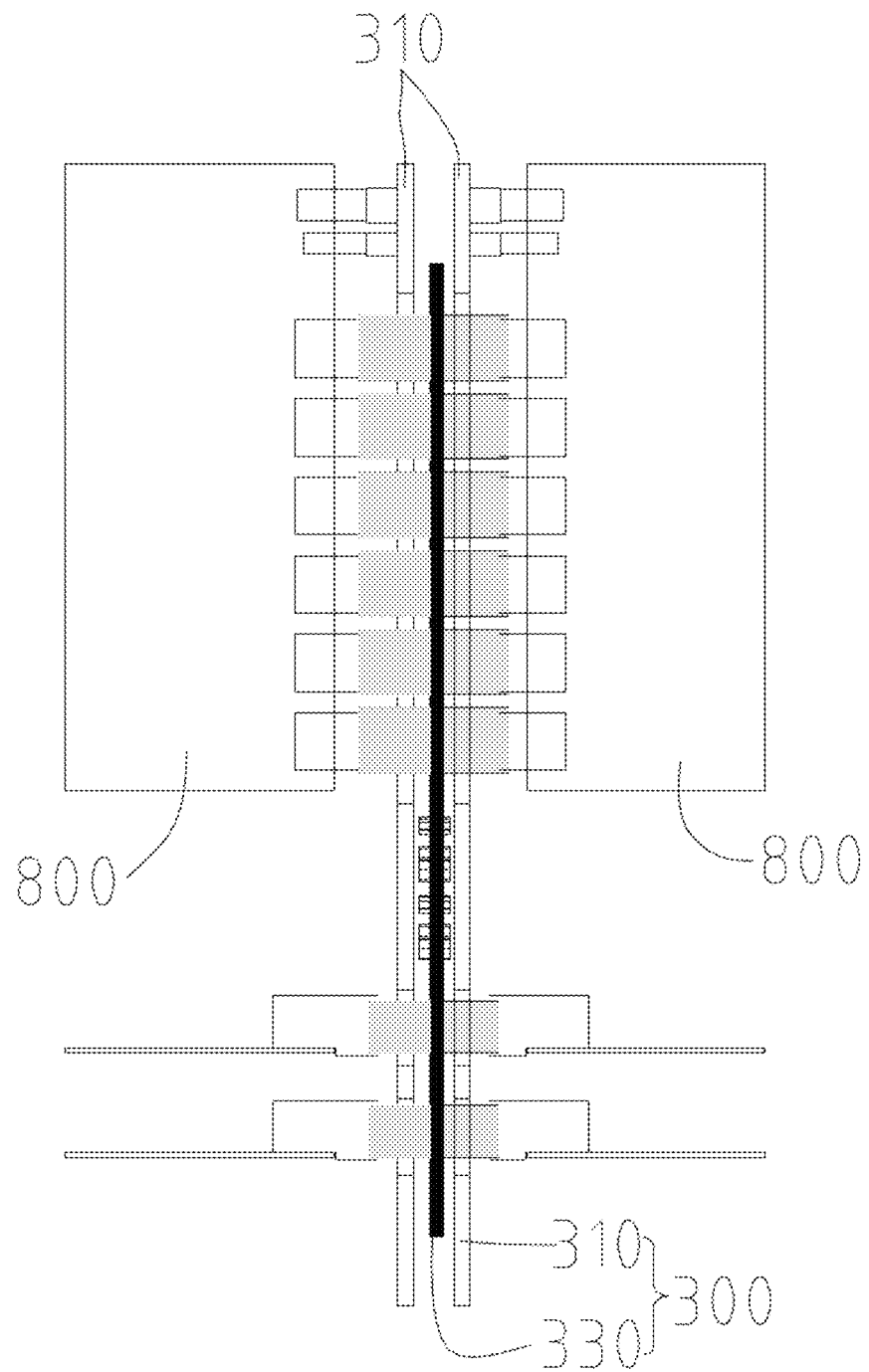
FIG. 18 is a schematic diagram of a backplane apparatus according to a twelfth embodiment of the present invention.

Referring to FIG. 18, a twelfth embodiment of the present invention provides a backplane apparatus 300, and the backplane apparatus 300 and the backplane apparatus 200 provided in the second embodiment are basically the same in structure and implement similar functions. Their difference lies in that the backplane apparatus 300 includes a pair of first backplane structures 310 and a second backplane structure 330. The second backplane structure 330 is located between the two first backplane structures 310, and boards 800 are inserted to both of the first backplane structures 310.

Figure 19:
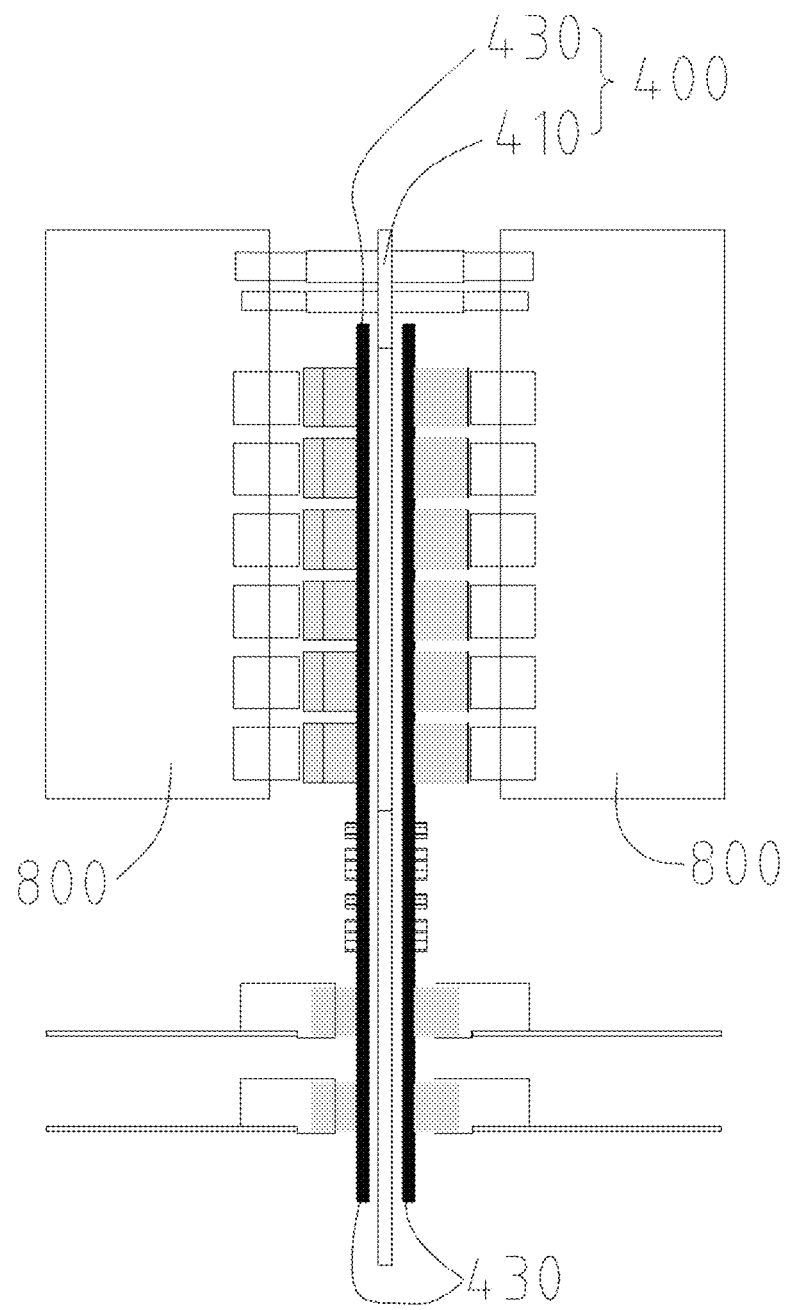
FIG. 19 is a schematic diagram of a backplane apparatus according to a thirteenth embodiment of the present invention.

Referring to FIG. 19, a thirteenth embodiment of the present invention provides a backplane apparatus 400, and the backplane apparatus 400 and the backplane apparatus 200 provided in the second embodiment are basically the same in structure and implement similar functions. Their difference lies in that the backplane apparatus 400 includes a first backplane structure 410 and a pair of second backplane structures 430. The first backplane structure 410 is located between the two second backplane structures 430, and boards 800 are inserted to both of the second backplane structures 430.

What is claimed is:

1. A backplane apparatus, configured to provide a channel and an interface for boards and comprising:
    at least one first backplane structure; and
    at least one second backplane structure, wherein the first backplane structure is configured to transmit power and low-speed signals; the second backplane structure is configured to transmit high-speed signals, low-speed signals, or optical signals; and the first backplane structure comprises at least one first backplane, multiple first connectors, and at least one connected space, wherein the first connectors are arranged on the first backplane, and the boards are electrically connected to the first backplane via the first connectors; and the second backplane structure comprises multiple second backplanes and multiple second connectors, wherein the second connectors are arranged on the second backplanes, the second backplanes are installed on the first backplane, and the second connectors are electrically connected to the boards by crossing the connected space or via the first connectors.

2. The backplane apparatus according to claim 1, wherein there are multiple connected spaces, and the connected spaces are hollow spaces in the first backplane.

3. The backplane apparatus according to claim 2, wherein the second backplanes are independent of each other.

4. The backplane apparatus according to claim 3, wherein each of the second backplanes matches one or more of the boards.

5. The backplane apparatus according to claim 4, wherein all or some of the second backplanes are connected to the boards via the first backplane.

6. The backplane apparatus according to claim 4, wherein the second backplanes are installed on the first backplane by using parallel assembly, stacking assembly, or splicing assembly.

7. The backplane apparatus according to claim 4, wherein there are multiple second backplane structures.

8. The backplane apparatus according to claim 4, wherein the second backplanes are on the same plane or different planes.

9. The backplane apparatus according to 1, wherein the backplane apparatus is plugged with the boards on both sides.

10. The backplane apparatus according to claim 9, wherein the backplane apparatus comprises a pair of first backplane structures and a second backplane structure, wherein the second backplane structure is located between the pair of first backplane structures, and boards are inserted to both of the first backplane structures.

11. The backplane apparatus according to claim 9, wherein the backplane apparatus comprises a first backplane structure and a pair of second backplane structures, wherein the first backplane structure is located between the pair of second backplane structures, and boards are inserted to both of the second backplane structures.

12. An apparatus comprising:
    a backplane to provide a channel and an interface for boards, the backplane comprising:
        at least one first backplane structure configured to transmit power and low-speed signals, the first backplane structure comprising:
            at least one first backplane, multiple first connectors, and at least one connected space, wherein the first connectors are arranged on the first backplane, and the boards are electrically connected to the first backplane via the first connectors; and
        at least one second backplane structure configured to transmit high-speed signals, low-speed signals, or optical signals, the second backplane structure comprising:
    multiple second backplanes and multiple second connectors, wherein the second connectors are arranged on the second backplanes, the second backplanes are installed on the first backplane, and the second connectors are electrically connected to the boards by crossing the connected space or via the first connectors.

* * * * *